United States Patent
Schwabe

(10) Patent No.: US 8,063,804 B2
(45) Date of Patent: Nov. 22, 2011

(54) SWITCHING UNIT FOR GENERATING AN OUTPUT VOLTAGE AS A FUNCTION OF A DIGITAL DATA VALUE AND METHOD FOR CALIBRATING THE SWITCHING UNIT

(75) Inventor: Dietmar Schwabe, Neumark (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/632,835

(22) Filed: Dec. 8, 2009

(65) Prior Publication Data
US 2010/0149008 A1    Jun. 17, 2010

(30) Foreign Application Priority Data
Dec. 11, 2008 (EP) .................................... 08171356

(51) Int. Cl.
*H03M 1/10* (2006.01)
(52) U.S. Cl. ........................ 341/120; 341/144
(58) Field of Classification Search .................. 341/144, 341/118, 120
See application file for complete search history.

(56) References Cited

U.S. PATENT DOCUMENTS

| 4,222,107 A | 9/1980 | Mrozowski et al. |
| 4,342,983 A | 8/1982 | Weigand et al. |
| 4,345,248 A * | 8/1982 | Togashi et al. ............... 345/90 |
| 6,556,154 B1 * | 4/2003 | Gorecki et al. ............. 341/118 |
| 2005/0001747 A1 | 1/2005 | Kuyel et al. |

OTHER PUBLICATIONS

Falconi et al., "Electronic interfaces", Sensors and Actuators B 121, 2007, pp. 295-329, Elsevier.

* cited by examiner

*Primary Examiner* — Peguy Jean Pierre

(57) ABSTRACT

With analog output stages of digital systems, the relationship between a digital data value, which is assigned to an analog output stage and to an actually generated output voltage, often does not correspond to a desired characteristic curve. A switching unit is provided to generate an output voltage as a function of a digital data value, the characteristic curve of which is adjusted by a calibration voltage. A method for calibrating a corresponding switching unit is also provided. The switching unit and the method are used in controllers.

13 Claims, 2 Drawing Sheets

SWITCHING UNIT FOR GENERATING AN OUTPUT VOLTAGE AS A FUNCTION OF A DIGITAL DATA VALUE AND METHOD FOR CALIBRATING THE SWITCHING UNIT

CROSS REFERENCE TO RELATED APPLICATIONS

This application claims priority of European Patent Office Application No. 08171356.2 EP filed Dec. 11, 2008, which is incorporated by reference herein in its entirety.

FIELD OF INVENTION

The invention relates to a switching unit for generating an output voltage as a function of a digital data value, with the switching unit comprising a digital-to-analog converter (DAC) and a unit for amplification. The invention also relates to a method for calibrating the switching unit.

BACKGROUND OF INVENTION

Switching units for generating an output voltage as a function of a digital data value are used in regulators for instance. In such cases a digital data value of an actuating variable is calculated at regular intervals by means of an algorithm for regulating a process. This calculated data value is then converted into an output voltage in order therewith to control an actuating element. The actuating element thus controlled reduces a control error in the process. The switching unit for generating the output voltage as a function of the digital data value is also referred to as an analog output stage of a (digital) regulator.

The relationship between the digital data value, which is assigned to a switching unit on the one hand and the output voltage actually generated herefor on the other hand is referred to as the characteristic curve of the switching unit. This characteristic curve generally deviates from a theoretical and/or desired characteristic curve. This arises as a result of tolerances which have to be accepted in components of the switching unit and during manufacture of the switching unit.

The deviation of the characteristic curve of a switching unit from the theoretical characteristic curve has the unwanted result, in the case of regulators for instance, of a new control error being generated in the process when controlling the actuating element by means of the switching unit.

To this end, it is known from the prior art for today's regulators not to assign the digital data value directly to the switching unit but instead firstly to calculate a modified data value by means of a mapping function. With this modified data value, the deviation of the characteristic curve of the analog output stage from a desired characteristic curve is then taken into account. The disadvantage of this method is that additional calculating steps are needed to calculate the modified data value. This requires additional calculating capacity and additional calculation time. As a result, the maximum possible rate of change of the output voltage is limited as a function of regularly generated, digital data values and thus the possibility of regulating rapidly changing processes.

The document U.S. Pat. No. 4,342,983 describes a dynamically calibratable digital-to-analog converter, which comprises a conventional, digitally controllable current source and an additional current source. The conventional, digitally controllable current source has a fixed predetermined characteristic curve, which has non-uniform quantization stages. Overlaying an output current of the digitally controllable current source and a current of the additional current source produces, in a summing point, a characteristic curve of the dynamically calibratable digital-to-analog converter with a uniform level of quantization stages.

The document US 2005/0001747 A1 describes a system in which an analog output voltage is generated from a digital input value by means of a digital-to-analog converter. A correction voltage is generated with the aid of a calibration circuit, said correction voltage being overlayed via a summing unit on the output voltage of the digital-to-analog converter. The behavior of the digital-to-analog converter itself is not calibratable here. The correction voltage is generated within the calibration circuit by means of a second digital-to-analog-converter.

The article "Electronic interfaces" by Falconi et al. (Falconi et al.: "Electronic interfaces", ELSEVIER SEQUOIA S.A., LOUSANNE, CH, Vol. 121, No. 1, Jan. 23, 2007, pages 295-329) describes a circuit for measuring a resistance of a sensor, with the circuit enabling the resistance to be digitally measured across a large range of possible resistance values. To enable an accurate measurement of the resistance value across the large range, a supply current from the sensor can be varied by adjusting a series resistance of a digital-to-analog converter. The series resistance is adjusted by selecting one of a number of series resistances. Similarly, a supply voltage of the sensor can be varied across a further digital-to-analog converter. The digital-to-analog converter and the series resistances cannot be changed in terms of their characteristic curves and do not need to have been calibrated prior to commissioning the circuit.

SUMMARY OF INVENTION

It is an object of the present invention to provide a possibility with which the characteristic curve of an analog output stage can be adjusted to a theoretical and/or desired characteristic curve in as simple a manner as possible.

The object is achieved with a switching unit, a method and a controller as claimed in the independent claims. Advantageous embodiments of the invention are specified in the dependent claims.

An analog output stage with a calibratable characteristic curve is provided in accordance with the invention by a switching unit for generating an output voltage as a function of a digital data value, comprising a first digital-to-analog converter, which is embodied so as to provide an analog voltage signal which depends on the data value and a first controllable voltage source, which is embodied so as to generate a calibration voltage as a function of a control value and a unit for amplification, which is embodied so as to generate the output voltage, with a value of the output voltage depending on the analog voltage signal and the calibration signal and a second controllable voltage source, which is embodied so as to generate a reference voltage as a function of a control value, with the first digital-to-analog converter being embodied so as to scale an amplitude of the analog voltage signal as a function of the reference voltage.

"Scaling" is understood here to mean that the amplitude of the analog voltage signal is also doubled by doubling the reference voltage. Providing a second controllable voltage source allows the characteristic curve of the switching unit to be defined in such a way that not only is an offset voltage compensated, but the full scale can be varied irrespective thereof for instance.

The second controllable voltage source is a second digital-to-analog converter and the control value for the second controllable voltage source is accordingly a digital control value.

With such a switching unit, a deviation of the characteristic curve of the switching unit from a theoretical or desired characteristic curve can be compensated by means of the first controllable voltage source. No additional calculating steps are needed for this during operation of the switching unit. Contrary to the prior art, an output voltage can be directly generated on the basis of an unchanged digital data value.

Furthermore, the advantage already cited emerges here that the characteristic curve can be automatically adjusted by a controller during operation for instance.

It is particularly advantageous here if
the first controllable voltage source is a third digital-to-analog converter and
the control value for the first controllable voltage source is a digital control value.

For instance, a controller of a regulator can then automatically adjust a characteristic curve of the switching unit to a desired characteristic curve during operation by outputting digital control values.

The control value for the first controllable voltage source is preferably determined such that with a predetermined minimal digital data value, a sum of a difference between the actual value of the output voltage and a target value of the same is smaller than a predetermined value.

A control value of this type compensates for an offset voltage of the switching unit. Such an offset voltage moves a characteristic curve of the switching unit by a constant offset relative to the theoretical or desired characteristic curve. The target value of the output voltage is provided here by the desired characteristic curve.

The control value is determined here in particular such that the calibration voltage Vkal is produced by the following equation as a function of a full scale value Vaf of the output voltage, an amplification factor G of the unit for amplification, a value for an overload reserve R and an offset error value Vaz of the switching unit:

$$Vkal = \frac{Vaf - (R+1) \cdot Vaz}{G \cdot R}.$$

The resulting characteristic curve of a calibrated switching unit does then not deviate from a characteristic curve, which is produced for a switching unit without offset voltage, for small digital data values, in particular for the minimal digital data value. Contrary to a simple displacement of the characteristic curve, the full scale value of the switching unit nevertheless remains unchanged here.

The control value for the second controllable voltage source is determined here in particular such that the reference voltage Vref is produced by the following equation as a function of the full scale value Vaf of the output voltage, the amplification factor G of the unit for amplification, the value for the overload reserve R and the offset error value Vaz of the switching unit:

$$Vref = \frac{Vaf - Vaz}{G \cdot R}.$$

The thus determined control value ensures that the full scale value is then also achieved when assigning a corresponding maximum digital data value, if the characteristic curve of the switching unit has been changed such that an offset voltage of the switching unit is compensated.

A particularly advantageous embodiment of the invention results if
the unit for amplification comprises a differential amplifier, in particular an operational amplifier, with an output of the differential amplifier being connected to an inverting input of the differential amplifier by way of a resistor and
the first controllable voltage source is connected to the inverting input of the differential amplifier by way of a further resistor and
the first analog-to-digital converter applies the analog voltage signal to a non-inverting input of the differential amplifier.

An inventive switching unit can be provided in a particularly cost-effective fashion with such a unit for amplification.

The object is also achieved by a method associated with the invention for calibrating a switching unit, which generates an output voltage by means of a digital-to-analog converter and by means of a unit for amplification and as a function of a digital data value. The term "calibration" is understood here to mean adjusting the characteristic curve.

The method includes the following steps:
1) assigning a data value to the digital-to-analog converter, with the data value representing a minimal numerical value of a predetermined value range and
2) detecting the output voltage as an actual value of an offset error (offset voltage);
3) assigning a data value to the digital-to-analog converter, with the data value representing a maximum numerical value of the predetermined value range and
5) detecting the output voltage as an actual value of a full scale;
6) applying a calibration voltage to an input of the unit for amplification, with the calibration voltage being generated as a function of the actual value of the offset error and the actual value of the full scale and
7) applying a reference voltage to an input of the digital-to-analog converter, with the reference voltage being generated as a function of the actual value of the offset error and the actual value of the full scale.

This method can be automatically implemented by a controller, for instance during commissioning of the switching unit. As a result, the characteristic curve of the switching unit is correctly adjusted to the desired characteristic curve even if the transmission behavior of the switching units changes as a result of the components ageing over time for instance. Regular implementation of the method is also possible during operation of the switching unit. As a result, the characteristic curve of the switching unit can be adjusted even if the transmission behavior of the switching unit changes by the components heating up during operation of the switching unit for instance. It is also possible to implement the steps 1) to 5) when manufacturing the switching unit and only the steps 6) and 7) during each commissioning or operation of the switching unit.

An advantageous embodiment of the method results here from the following additional steps:
8) detecting a temperature value on the switching unit,
9) changing the calibration voltage and/or the reference voltage as a function of the temperature value.

As the temperature behavior of the components has a large influence on the transmission behavior of a switching unit, it is possible as a result of changing the calibration voltage and/or reference voltage to ensure that the characteristic curve of the switching unit also remains unchanged during a change in temperature.

The invention also includes a regulator with an analog output stage, which includes an inventive switching unit. In addition or alternatively, the regulator is configured to implement an inventive method for calibration purposes.

The inventive regulator is also able to precisely adjust rapidly changing processes to a target state.

BRIEF DESCRIPTION OF THE DRAWINGS

The invention is described below with reference to exemplary embodiments, in which.

DETAILED DESCRIPTION OF INVENTION

The following examples represent preferred embodiments of the invention.

Figure 1:
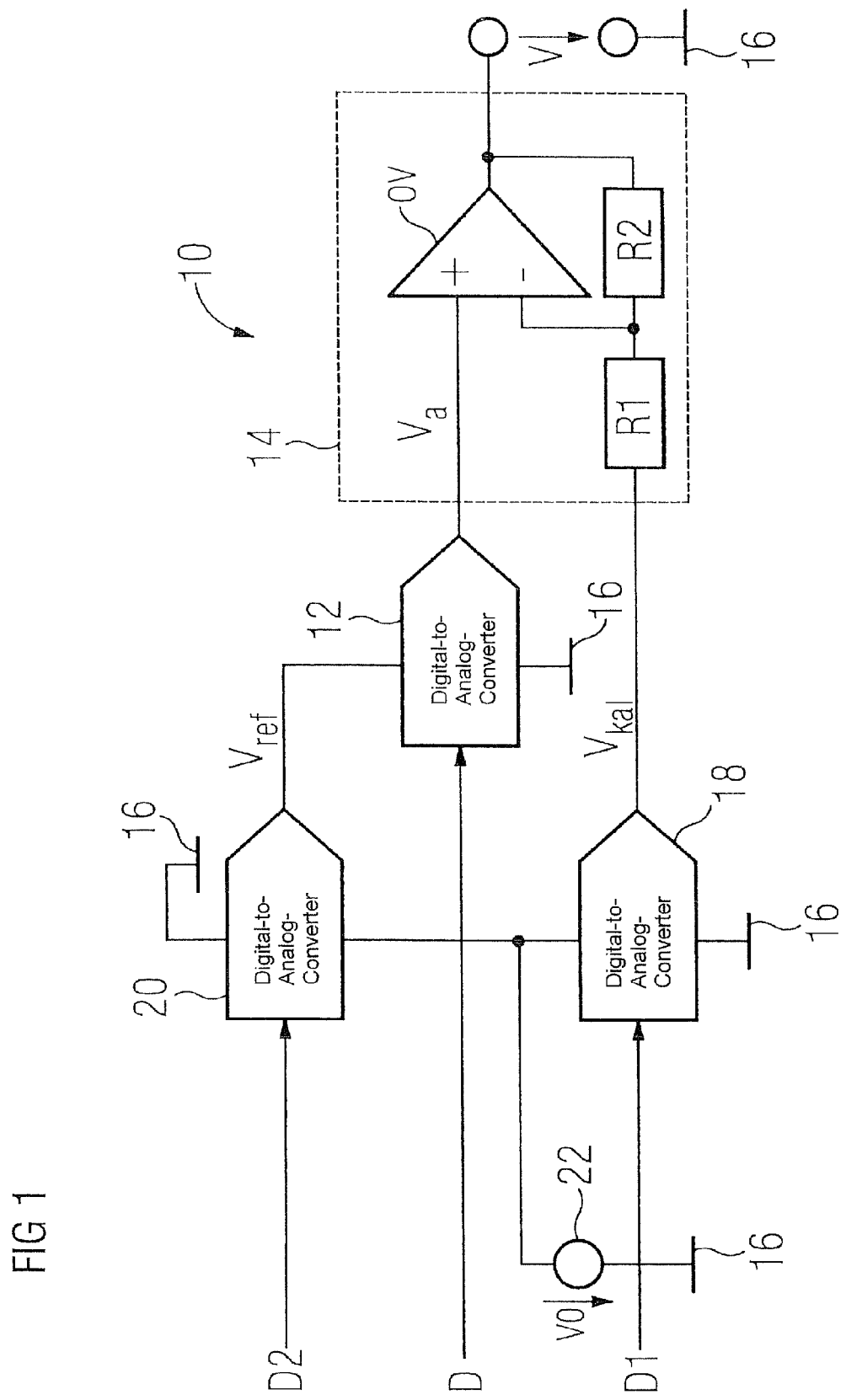
FIG. 1 shows a circuit diagram of an embodiment of an inventive switching unit.

In the example in FIG. 1, a switching unit 10 has a digital-to-analog converter 12 and an amplification stage 14. The latter provides a unit for amplification within the meaning of the invention. The amplification stage 14 is foamed from an operational amplifier OV and two resistors R1 and R2.

Here the switching unit 10 forms part of a regulator with a controller (not shown in FIG. 1), which generates digital data values D on the basis of an algorithm for regulation. The switching unit 10 controls an actuating element (not shown in FIG. 1) as a function of the data values D. To this end, the switching unit 10 generates an output voltage V at an output of the amplifier stage 14. The output of the amplifier stage 14 is connected to a control input of the actuating element. The output voltage V of the amplifier stage 14 is unipolar in the example shown, i.e. the output voltage V always has a value greater than or equal to 0 V.

All voltages indicated in FIG. 1 are related to a common earth 16 of the switching unit 10.

If a data value D is transferred to the switching unit 10, the digital-to-analog converter 12 generates an associated analog voltage signal Va, which is present at a non-inverting input of the operational amplifier OV. The amplifier stage 14 then amplifies the voltage signal Va to the output voltage V.

The amplifier stage 14 is characterized by an amplifier factor G by which the voltage signal Va is amplified. This amplifier factor G is determined by the two resistors R1 and R2.

The analog voltage signal V1 can assume voltage values between a few millivolts and a reference voltage Vref of the digital-to-analog converter 12. In the present example, Vref equates to 2.5V. The voltage signal Va then assumes this value if the digital data value D assumes its largest possible numerical value. This value currently amounts to $2^N-1$, with N being the word length of the data value D, in other words the number of bits which the data value D includes overall. N=10 here, so that the largest possible value corresponds to a decimal value of 1023.

The voltage signal Va then assumes the smallest voltage value, if the digital data value D has assumed its smallest possible numerical value. This smallest possible value is the binary value 0 here. As a result of manufacturing-specific exemplary fluctuations, the digital-to-analog converter 12 does not generate, as would be theoretically expected, a voltage signal Va with an amplitude of 0 V. Instead, the voltage signal deviates from the value 0 V by an offset voltage of a few millivolts.

The operational amplifier OV of the amplifier stage 14 also has a voltage offset of a few millivolts: even with a value of the voltage signal Va of 0 V, the output voltage would not amount to 0 V at the output of the amplifier stage 14 if the resistor R1, as with a comparable analog output stage from the prior art, was directly connected to the earth 16. The offset voltages of the digital-to-analog converter 12 and of the operational amplifier OV accumulate here to form an overall offset voltage of the switching unit 10.

This offset voltage is compensated by a calibration voltage Vkal, which is provided by a second digital-to-analog converter 18. The calibration voltage Vkal is determined here such that an output voltage V of 0 V results, if the digital data value D assumes its smallest possible numerical value. The second digital-to-analog converter 18 thus forms a first controllable voltage source within the meaning of the invention, with the voltage value being controllable by a digital control value D1. The control value D1 is generated by the controller of the regulator.

The reference voltage Vref of the digital-to-analog converter 12 is also provided by a further digital-to-analog converter 20. Within the meaning of the invention, this represents a second controllable voltage source, which can be controlled by a digital control value D2. The control value D2 is also generated by the controller of the regulator.

A reference voltage V0 of the two digital-to-analog converters 18 and 20 is provided by a further voltage source 22. This voltage source 22 is only shown in FIG. 1 by a symbol.

By the controller defining the two digital control values D1 and D2, it calibrates the characteristic curve of the switching unit 10, i.e. it determines the relationship between the digital data value D and the output voltage V generated herefor. As a result, the data values D can be written directly (without conversion as in the prior art) into the digital-to-analog converter 12. The desired characteristic curve of the switching unit 10 results directly from the value of the calibration voltage Vkal and the value of the reference voltage Vref. By omitting a calculation of modified data values D, in which the transmission behavior of the switching unit is taken into account, a shorter calculation time of the controller results. This provides the controller with a higher output rate of consecutive data values. Furthermore, the full resolution of the digital-to-analog converter 12 can be used, since no calculation errors result in inconsistencies in the output voltage (e.g. jumps in the temporal course).

To be able to define the two control values D1 and D2, in the present example, the characteristic curve of the non-calibrated switching unit 10 has been determined by the manufacturer by means of an embodiment of an inventive method for calibrating a switching unit. To this end, a calibration voltage Vkal of 0 V and a reference voltage Vref of 2.5V was initially generated. Finally, a minimal numerical value, i.e. currently a binary value of 0, was then assigned as a data value D to the switching unit 10 and the value of the output voltage V was detected as an actual value of an offset error Vaz. The largest possible numerical value $2^N-1$ was then assigned as data value D. The output voltage V generated at the maximum numerical value was detected as an actual value of the full scale Vaf.

The characteristic curve of the non-aligned switching unit 10 results from the measurement of the offset error Vaz and of the full scale Vaf which was implemented by the manufacturer. For an effective operation of the regulator, this characteristic curve is transformed into an ideal characteristic curve. A value of zero is set as a target value and/or ideal value of the offset error. Furthermore, an overload reserve R is provided, i.e. a digital full scale value Dfs is determined as a maximum numerical value, said full scale value being smaller than the theoretically largest possible numerical value $2^N-1$. A factor Dfv is determined at the full scale value Dfs, which details the extent to which the digital value range of the data value D is used. The factor is calculated as a Dfv=2*Dfs/$2^N$ in this example. The full scale value Dfs is selected here such that the factor Dfv has a value greater than 1 and less than 2. The overload reserve R then currently results in R=Dfv−1, so that a value between 0 and 1 results for the overload reserve R. The overall circuit is therefore configured by means of the overload reserve R such that the reference voltage Vref is greater by a certain sum than is needed for a full scale of the output stage.

The necessary reference voltage Vref and the necessary calibration voltage Vkal are initially determined on the basis of equations as a function of the offset error Vaz and the full scale value Vaf, said equations being predetermined in one embodiment of the invention Finally, corresponding control values D1 and D2 have been stored in the controller, so that when commissioning the regulator, the desired characteristic curve of the switching unit 10 can be automatically adjusted by the controller.

The overload reserve R and/or determination of a full scale value Dfs produces an advantageous effect, such that the full resolution of the digital-to-analog converter 12 is used.

The controller is also able to adjust the control values D1 and D2 when changing the ambient temperature of the switching unit 10. The characteristic curve of the switching unit 10 therefore even remains unchanged if the operating behavior of the digital-to-analog converter 12, of the operational amplifier OV or of the resistors R1 and R2 changes due to the components heating up. A correct adjustment is enabled by the temperature around the switching unit 10 being detected by means of a temperature sensor (not shown in FIG. 1). The necessary changes for the control values D1 and D2 are then read out via a value table at a detected temperature value. The value table is stored in the controller. It has been created during manufacture of the switching unit 10 by the manufacturer using measurements. Contrary to the prior art, no additional calculations for changing the data value D in each output cycle of the controller are needed in order to compensate for a change in the characteristic curve.

In another embodiment of the switching unit, the control values D1, D2 are adjusted in a different fashion. Here the controller is equipped with means for detecting the output voltage. At regular intervals, for instance each minute, the controller compares the output voltage actually generated by the switching unit to form a data value with the output voltage, as must be produced by a desired characteristic curve. It is possible with the aid of several such comparisons and a deviation measured hereby to allow control values to be automatically adjusted by means of the controller.

In a further embodiment of the inventive switching unit, several output ranges are provided, i.e. at least two desired characteristic curves are exchanged during operation. This causes the control values D1 and D2 to be changed. The calibration values are therefore included just like the output range, i.e. the desired range between the minimal and maximum output voltage V. This adjustment of the characteristic curve, which is enabled by an inventive switching unit, for instance by halving the control values D1 and D2, is advantageous such that the digital-to-analog converter 12 can be continuously operated with a full resolution and without other restrictions.

Figure 2:
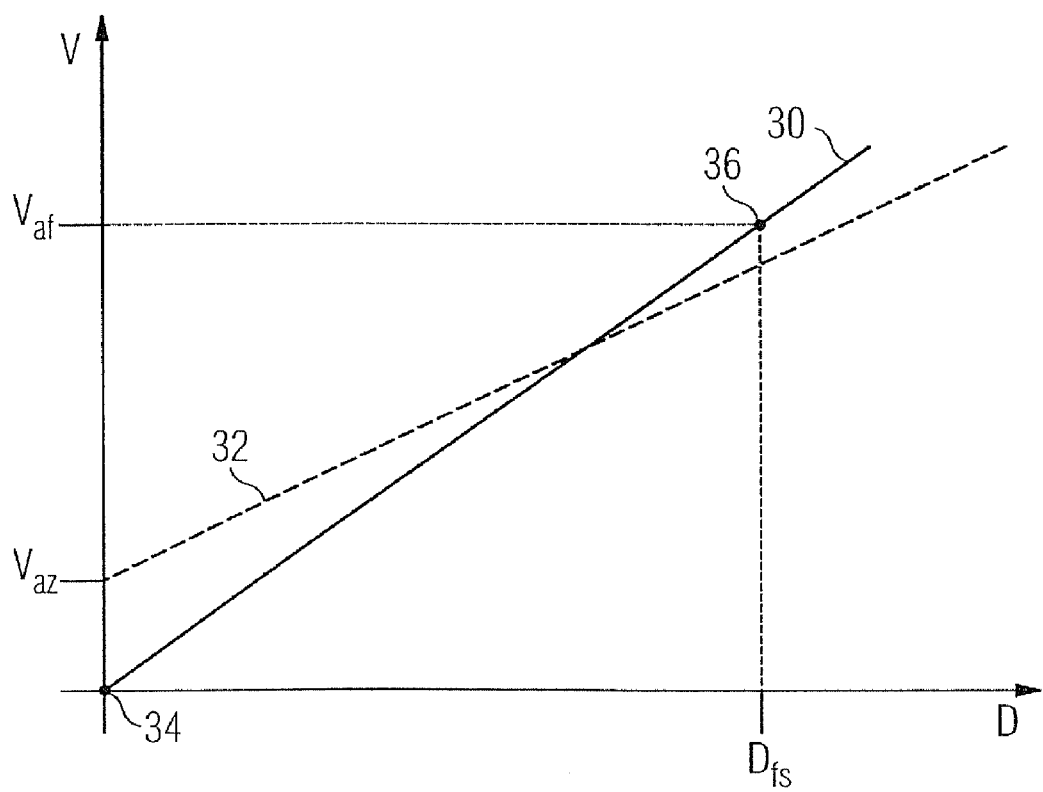
FIG. 2 shows a diagram with a characteristic curve of a switching unit, with the characteristic curve having been adjusted by an embodiment of an inventive method.

The diagram in FIG. 2 shows two characteristic curves 30, 32 of a switching unit. The characteristic curves 30, 32 describe the relationship between a digital data value D and an output voltage V of the switching unit.

The characteristic curve 30 is produced by an embodiment of an inventive method for calibrating the switching unit. By comparison, FIG. 2 shows the characteristic curve 32, as is produced for the non-calibrated switching unit.

The characteristic curve 32 shows that the switching unit has an offset voltage Vaz without calibration. Even if the digital data value D assumes its minimal numerical value, the output voltage V has a voltage value Vaz which is greater than zero.

The method for calibration defines two working points 34, 36 of the switching unit so that the desired characteristic curve 30 is produced overall for the switching unit. In the first working point 34, the output voltage V equates to zero, if the digital data value assumes its minimal numerical value. This is achieved by means of a calibration voltage. The calibration voltage is dependent here on the measured offset voltage Vaz. The calibration voltage is applied to a unit for amplification, which forms part of the switching unit. The calibration voltage displaces the reference potential of the unit for amplification correspondingly the offset voltage Vaz. In the second working point 36, the output voltage V assumes a predetermined full scale value Vaf, which here however is less than the maximum possible output voltage V which can be generated by the unit for amplification. The second working point 36 defines that the full scale value Vaf is output if the digital data value D assumes a full scale value Dfs. This full scale value Dfs is also smaller than the maximum possible numerical value which the data value D can assume. The second working point 36 is thus determined such that an overload reserve R results for the switching unit. This means that a data value D can also be assigned to the switching unit, which is greater than the full scale value Dfs, without a digital-to-analog converter of the switching unit or the unit for amplification having been overmodulated as a result.

In summary, the described exemplary embodiments indicate how a characteristic curve of an analog output stage can be adjusted to a desired characteristic curve without the processing speed of the output stage being negatively affected in the process.

The invention claimed is:

1. A switching unit for generating an output voltage as a function of a digital data value, comprising:
    a first digital-to-analog converter providing an analog voltage signal which depends on the digital data value;
    a first controllable voltage source generating a calibration voltage as a function of a control value;
    an amplification unit configured to generate the output voltage, wherein a value of the output voltage depends on the analog voltage signal and the calibration voltage;
    a second controllable voltage source generating a reference voltage as a function of a digital control value, the second controllable voltage source being a second digital-to-analog converter,
    wherein the first digital-to-analog converter scales an amplitude of the analog voltage signal as a function of the reference voltage, and
    wherein the digital control value is determined for the second controllable voltage source such that, with a predefined maximum digital data value, a sum of a difference between an actual value of the output voltage and a target value of the output voltage is smaller than a predetermined value.

2. The switching unit as claimed in claim 1, wherein
the first controllable voltage source is a third digital-to-analog converter and
the control value for the first controllable voltage source is a digital control value.

3. The switching unit as claimed in claim 2, wherein the control value for the first controllable voltage source is determined such that, with a predetermined minimal digital data value, a sum of a difference between an actual value of the output voltage and a target value of the output voltage is smaller than a predetermined value.

4. The switching unit as claimed in claim 1, wherein the control value for the first controllable voltage source is determined such that, with a predetermined minimal digital data value, a sum of a difference between an actual value of the output voltage and a target value of the output voltage is smaller than a predetermined value.

5. The switching unit as claimed in claim 1, wherein
the amplification unit comprises a differential amplifier, an output of the differential amplifier being connected to an inverting input of the differential amplifier by a resistor,
the first controllable voltage source is connected to the inverting input of the differential amplifier by a further resistor, and
the first analog-to-digital converter applies the analog voltage signal to a non-inverting input of the differential amplifier.

6. A method for calibrating a switching unit generating an output voltage by a digital-to-analog converter and by an amplification unit and as a function of a digital data value, comprising:
assigning a first data value to a first digital-to-analog converter, the first data value representing a minimal numerical value of a predetermined value range;
detecting the output voltage as an actual value of an offset error;
assigning a second data value to the first digital-to-analog-converter, the second data value representing a maximum numerical value of the predetermined value range;
detecting the output voltage as an actual value of a full scale value;
applying a calibration voltage to an input of the amplification unit, the calibration voltage being generated as a function of the actual value of the offset error and the actual value of the full scale and being provided by a second digital-to-analog converter; and
applying a reference voltage to an input of the first digital-to-analog converter, the reference voltage being generated as a function of the actual value of the offset error and the actual value of the full scale and being provided by a third digital-to-analog converter.

7. The method as claimed in claim 6, further comprising:
detecting a temperature value on the switching unit; and
changing the calibration voltage Vkal as a function of the temperature value.

8. The method as claimed in claim 7, further comprising:
changing the reference voltage Vref as a function of the temperature value.

9. The method as claimed in claim 6, further comprising:
detecting a temperature value on the switching unit; and
changing the calibration voltage Vkal and the reference voltage Vref as a function of the temperature value.

10. A control unit, comprising:
an analog output stage with a switching unit, the switching unit comprising:
a first digital-to-analog converter providing an analog voltage signal which depends on the digital data value;
a first controllable voltage source generating a calibration voltage as a function of a control value;
an amplification unit configured to generate the output voltage, wherein a value of the output voltage depends on the analog voltage signal and the calibration voltage;
a second controllable voltage source generating a reference voltage as a function of a digital control value, the second controllable voltage source being a second digital-to-analog converter,
wherein the first digital-to-analog converter scales an amplitude of the analog voltage signal as a function of the reference voltage, and
wherein the digital control value is determined for the second controllable voltage source such that, with a predefined maximum digital data value, a sum of a difference between an actual value of the output voltage and a target value of the output voltage is smaller than a predetermined value.

11. The control unit as claimed in claim 10, wherein
the first controllable voltage source is a third digital-to-analog converter and
the control value for the first controllable voltage source is a digital control value.

12. The control unit as claimed in claim 10, wherein the control value for the first controllable voltage source is determined such that, with a predetermined minimal digital data value, a sum of a difference between an actual value of the output voltage and a target value of the output voltage is smaller than a predetermined value.

13. The control unit as claimed in claim 10, wherein
the amplification unit comprises a differential amplifier, an output of the differential amplifier being connected to an inverting input of the differential amplifier by a resistor,
the first controllable voltage source is connected to the inverting input of the differential amplifier by a further resistor, and
the first analog-to-digital converter applies the analog voltage signal to a non-inverting input of the differential amplifier.

* * * * *